US006952269B2

(12) United States Patent
Maiz et al.

(10) Patent No.: US 6,952,269 B2
(45) Date of Patent: Oct. 4, 2005

(54) APPARATUS AND METHOD FOR ADIABATICALLY HEATING A SEMICONDUCTOR SURFACE

(75) Inventors: Jose A. Maiz, Portland, OR (US); Sarangapani Sista, Hillsboro, OR (US); Mark Liu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 171 days.

(21) Appl. No.: 10/253,762

(22) Filed: Sep. 24, 2002

(65) Prior Publication Data

US 2004/0058501 A1 Mar. 25, 2004

(51) Int. Cl.$^7$ ................................................ G01B 9/02
(52) U.S. Cl. ........................................ 356/479; 438/682
(58) Field of Search ...................... 438/655, 664; 355/52

(56) References Cited

U.S. PATENT DOCUMENTS 4,615,765 A * 10/1986 Levinson .................... 156/643
6,420,264 B1 * 7/2002 Talwar ....................... 438/682

OTHER PUBLICATIONS

American Institute of Physics Handbook, Dwight E. Gray, ISBN 07–001485–X, Mcgraw–Hill 1972.p. 6–118–6–123.*

* cited by examiner

Primary Examiner—John F. Niebling
(74) Attorney, Agent, or Firm—Blakely, Sokoloff, Taylor & Zafman LLP

(57) ABSTRACT

A method for adiabatically heating semiconductor device surfaces, including using capping layers to prevent deformation of surfaces. Using the method, semiconductor surfaces having varying topographies or topologies may be heated adiabatically. In an embodiment of the method, one or more capping layers may be formed over a semiconductor surface, to further prevent deformation of semiconductor surfaces.

31 Claims, 5 Drawing Sheets

APPARATUS AND METHOD FOR ADIABATICALLY HEATING A SEMICONDUCTOR SURFACE

FIELD

Integrated circuits, and heating semiconductor structures and substrates.

BACKGROUND

The processes involved in the manufacture of a semiconductor circuit substrate include, among others, layering, patterning, doping and heat treatment. One type of heat treatment concerns the use of heat to alloy conductor lines (e.g., form contacts) to a wafer surface. This type of heat treatment may take place in a nitrogen gas atmosphere. Annealing is another type of heat treatment.

Annealing, in one aspect, cures defects caused in a crystal wafer (e.g., crystal semiconductor wafer) structure during the introduction of dopant. One method of introducing dopant is ion implantation. In ion implantation, a wafer is bombarded with ion energy. As ions enter the wafer, the ions collide with atoms in the crystal wafer structure, thus causing defects in the crystal wafer structure. These defects may degrade semiconductor characteristics such as mobility. Annealing may be used to recrystallize wafer material and to minimize crystal defects. In another aspect, annealing may be used to activate dopants.

If annealing is performed in a tube furnace, heat is typically applied at a temperature between 600 and 1000 C. Annealing in a tube furnace may be performed in a hydrogen atmosphere. Rapid Thermal Annealing (RTA) and Rapid Thermal Processing (RTP) are two other processes used to heat surfaces of semiconductor devices. These processes involve directing light at a semiconductor surface for a relatively long duration (e.g., from tenths of a second to multiple seconds). Laser annealing is another process used to heat surfaces. Present state of the art laser annealing commonly uses pulses lasting tens of nanoseconds resulting in uneven heating of surfaces with topography or topology. In RTP, anneal may be performed in seconds, while tube process annealing may require a heat treatment extending from 15 to 30 minutes. The long anneal times required by such processes can result in thermal diffusion. Specifically, following the introduction of dopant, when a host material is heated, dopant may diffuse laterally or vertically, and may therefore hinder efforts to form, for example, an abrupt P-N junction.

Additionally, processes like RTP result in uneven heating of various surface points on a semiconductor or substrate surface that have varying topographies or topologies. For example, the topography of a semiconductor device may vary across the surface of the device. A surface point on top of a substrate, in an area between two gates, may be in a lower relative vertical position than a surface point which is on top of a polysilicon line. Because the topography differs among these surface points, prior art methods of heating semiconductor devices may result in uneven heating among these surface points. Specifically, those surface points that have a higher vertical position may be over-heated, in comparison to surface points having a lower vertical position. Over-heating may result in the softening of surface materials and/or sub-surface materials. Softening may lead to deformation of the semiconductor device surface, and may prevent or reduce the capacity to form abrupt junctions on the semiconductor device.

Just as topography differs among surface points, topology may also differ among surface points. In this regard, a substrate may include sections having different optical, chemical and/or electrical properties. For example, a substrate may include a silicon section, a P-N junction, and an oxide isolation area. Surface points on top of these materials may have a similar topography, but the topology differs, which affects how the surface points react to heat. Specifically, those surface points in respect of which the surface materials and/or sub-surface materials have relatively lower melting points may be over-heated, in comparison to surface points having a relatively higher melting point. Differences in the thermal conductivity of various materials can also result in an uneven heating of the surfaces. Over-heating may result in the softening of surface material and sub-surface materials. Softening may lead to deformation of the semiconductor device surface, and may prevent or reduce the capacity to produce abrupt junctions in the semiconductor device.

BRIEF DESCRIPTION OF THE DRAWINGS

The features, aspects, and advantages of the disclosed subject matter will become more fully apparent from the following Detailed Description and appended claims when taken in conjunction with accompanying illustrations in which:

DETAILED DESCRIPTION

Figure 1:
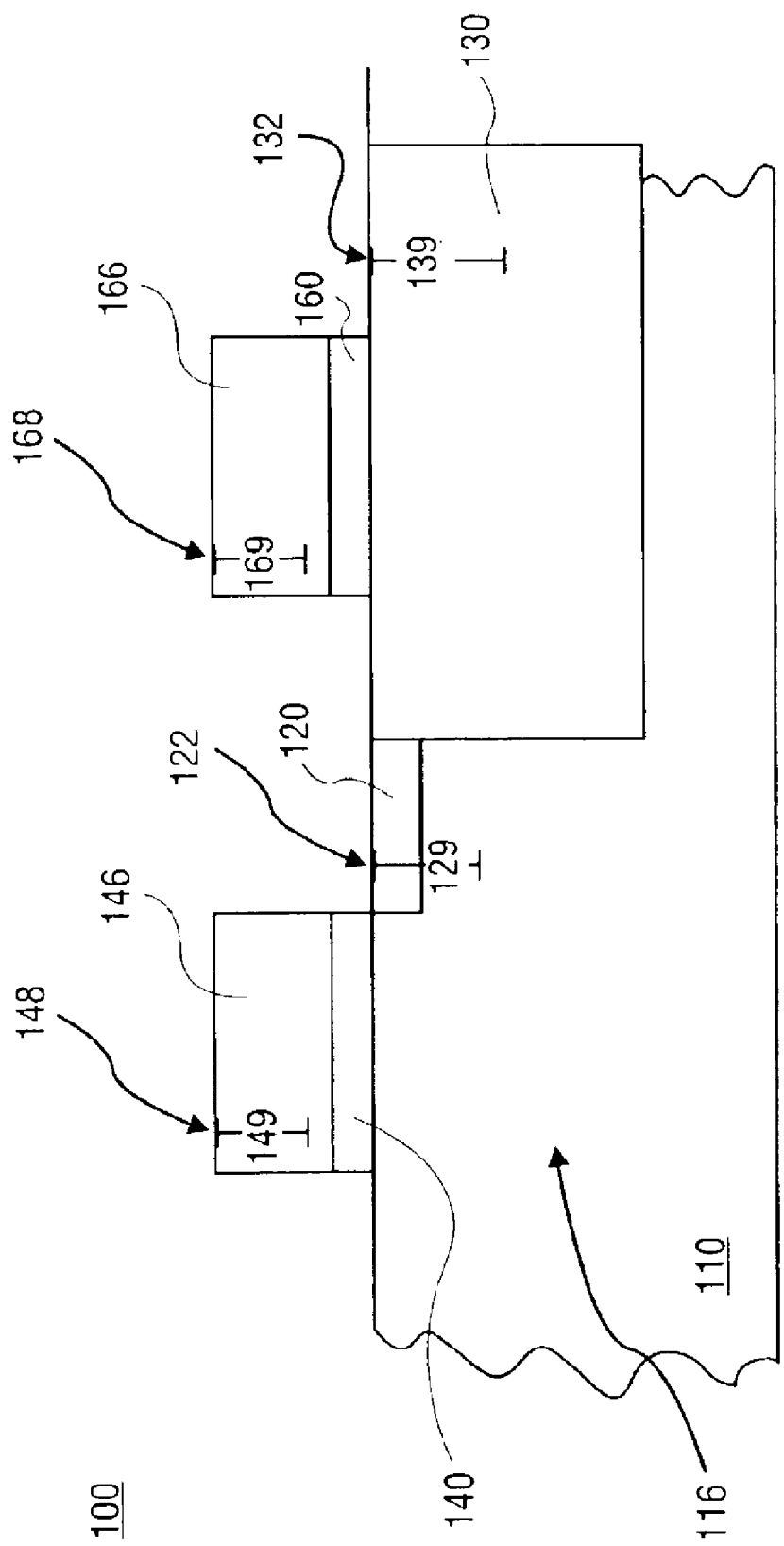
FIG. 1 is an illustration of a cross-sectional view of an embodiment of a semiconductor substrate with devices formed thereon.

FIG. 1 shows semiconductor structure 100. Semiconductor structure 100 includes substrate 110. Substrate 110 may include various sections having different optical, chemical and/or electrical properties. In one embodiment, substrate 110 includes silicon section 116, P-N junction 120 and oxide isolation area 130. Devices may be formed on top of substrate 110. In an embodiment, a gate dielectric 140 is formed on silicon section 116. In an embodiment, polycrystalline silicon ("polysilicon") layer 146 is formed or deposited on gate dielectric 140. Similarly, in an embodiment, polysilicon layer 166 is formed or deposited on top of gate dielectric 160 over the oxide isolation area 130. In other embodiments, polysilicon layer 166 may be deposited directly on oxide isolation 130.

The topography of semiconductor structure 100 varies across the device. For example, surface point 122, which is on top of P-N junction 120, is in a lower relative vertical position (as viewed) than surface point 148, which is on top of polysilicon layer 146. Because the topography differs among these surface points, prior art methods of heating semiconductor device 110 may result in uneven heating among these surface points.

Just as topography differs among surface points, topology may also differ among surface points. For example, in an embodiment, surface point 148 is on top of polysilicon layer 146, while surface point 122 is on top of P-N junction 120. Accordingly, surface points 148 and 122 represent two surface points having different topologies in respect of the surface materials and/or sub-surface materials under surface point 122. A third topology may exist in respect of surface point 168, which is on top of polysilicon 166.. Although surface point 148 and surface point 168 both are above polysilicon, their topologies may differ because the substrate material below the respective polysilicon layers differs. Specifically, silicon section 116 lies below surface point 148, and oxide isolation area 130 lies below surface point 168. Because the topology, including heat conduction characteristics of the underlying layers, may differ among these surface points, prior art methods of heating semiconductor device 110 may result in uneven heating among these surface points. A fourth topology may exist in respect of surface point 132, which is over oxide isolation area 130.

In an embodiment, prior to irradiating semiconductor structure 100, a desired heat absorption depth 149 is determined in respect of polysilicon layer 146. Heat absorption depth 149 will extend into only polysilicon layer 146. In one embodiment, heat absorption depth 149 may range from 30–100 nanometers (nm). In an embodiment, heat absorption depth 149 may also be less than 30 nm.

A desired irradiation wavelength based on the optical absorption coefficient associated with polysilicon layer 146 and the desired heat absorption depth 149 may be determined in an embodiment. A wavelength is determined, in one embodiment, such that polysilicon layer 146, when irradiated, is not heated below the desired heat absorption depth 149. In an embodiment, a wavelength in the range of 300–400 nm is employed. Different wavelengths may be needed depending on the optical absorption coefficients of the particular materials that make up a conductor layer, such as polysilicon layer 146.

A desired irradiation pulse duration for adiabatically heating polysilicon layer 146 may also be determined in an embodiment. At least a portion of semiconductor structure 100, including at least a portion of polysilicon layer 146 is irradiated. Irradiation includes at least one pulse of energy directed at the irradiated portion of semiconductor structure 100 for a duration substantially equivalent to the desired irradiation pulse duration at a wavelength that is substantially equivalent to the desired irradiation wavelength. In an embodiment, the duration of the irradiation pulse is less than a thermal time constant associated with a material in the portion of semiconductor structure 100 that is irradiated. Accordingly, the surface of the portion is adiabatically heated, because heating of the desired surfaces will take place before the heat has time to conduct down below a desired absorption depth. As such, the heating process is substantially independent of the underlying material or materials. In one embodiment, the desired irradiation pulse duration is less than a 30 picosecond (ps) pulse. In another embodiment, the desired irradiation pulse is less than a 50 ps pulse. In one embodiment, in general, the irradiation pulse(s) are carried out with a power level of 18 MW/cm$^2$ and a pulse energy of 5.4E-4 J/cm$^2$. The figures described for the desired radiation pulse duration, power level and energy are representative of an embodiment, and should not be considered as limiting the scope of the subject matter described in this specification. Irradiation may be performed with a variety of energy sources, including electromagnetic energy sources. Light amplification by stimulated emission of radiation (laser), or coherent energy sources, may be used in an embodiment. An yttrium aluminum garnet (YAG) laser is used in an embodiment.

As described above, in general, absorption depth 149 in polysilicon layer 146 may be controlled by determining a desired wavelength for irradiation to be applied at surface point 148. Furthermore, in an embodiment, a desired irradiation wavelength may be determined so that the heat absorption depth below multiple surface points may, in general, be controlled, even though the surface points have varying topographies. In one embodiment, the surface points are irradiated concurrently. Representatively, when surface point 148 is irradiated, a desired wavelength may be determined to control both absorption depth 149 below surface point 148 and absorption depth 129 below surface point 122, even though surface point 122 is on a lower vertical plane than surface point 148. Absorption depth 129 is measured downward from surface point 122 in an embodiment. In one embodiment, when surface point 148 and surface point 122 are irradiated, heat will not be absorbed in polysilicon layer 146 below absorption depth 149, and heat will not be absorbed in silicon section 116 of substrate 110 below absorption depth 129. In an embodiment, absorption depth 129 is substantially equivalent to absorption depth 149.

In an embodiment, a desired irradiation wavelength may be determined to control the absorption depth below various surface points during irradiation, even though those surface points, and/or the materials under the surface point, have varying topologies, including, for example, varying heat conduction characteristics. For example, an irradiation wavelength may be determined such that when surface point 148 above polysilicon layer 146 is irradiated, in addition to controlling absorption depth 149, absorption depths with other surface points on semiconductor structure 100 may also be controlled, even though materials different from polysilicon lie at the surface points and/or under the surface points. Representatively, prior to irradiation of surface point 148, a desired irradiation wavelength may be determined to control both absorption depth 149 below surface point 148 and absorption depth 129 below surface point 122, even though P-N junction 120 in substrate 110 lies below surface point 122, and may have heat conduction characteristics different from polysilicon layer 146, which is below surface point 148. In one embodiment, when surface point 148 and surface point 122 are irradiated, heat will be absorbed in polysilicon layer 146 down to absorption depth 149, and heat will be absorbed in a section of P-N junction 120 and, in an embodiment, through a section of silicon section 116 that lies beneath P-N junction 120, down to absorption depth 129. In an embodiment, when surface point 148 and surface point 122 are irradiated, heat will not be absorbed in polysilicon layer 146 below absorption depth 149, and heat will not be absorbed below absorption depth 129 in a section of silicon substrate 116 that lies beneath P-N junction 120 in an embodiment. In some embodiments, absorption depth 129 only extends into P-N junction 120, and does not extend beyond P-N junction 120 into silicon section 116. In an embodiment, absorption depth 129 is substantially equivalent to absorption depth 149. Additionally, it is recognized that absorption depth may be controlled in respect of other types of junctions, not merely P-N junctions as described above.

As described above, a topology may exist in respect of surface point 168 that is different from the topology of surface point 148, even though both of these surface points lie on top of polysilicon layers (e.g., polysilicon layers 166 and 146, respectively). Specifically, silicon section 116 lies below surface point 148, and oxide isolation area 130 lies below surface point 168. Because the topology, including heat conduction characteristics of the underlying layers, may differ among these surface points, prior art methods of heating semiconductor structure 100 may result in uneven heating among these surface points. However, in an embodiment, prior to irradiation, a desired irradiation wavelength may be determined to control absorption depth 149 below surface point 148 and absorption depth 169 below surface point 168. Absorption depth 149 and absorption depth 169 may be controlled regardless of whether surface points 148 and 168 are heated concurrently, in an embodiment. In one embodiment, when surface point 148 and surface point 168 are irradiated, heat will not be absorbed in polysilicon layer 146 below absorption depth 149, and heat will not be absorbed in polysilicon layer 166 below absorption depth 169. Absorption depth 169 extends only into polysilicon layer 166, in an embodiment. In certain other embodiments, absorption depth 169 is substantially equivalent to absorption depth 149. As shown in the above embodiments, absorption depths 149 and 169 in polysilicon layers 146 and 166 may be controlled. However, it is recognized that absorption depths may be controlled in other types of conducting layers or other types of materials, not merely in polysilicon. For example, representatively, absorption depth may be controlled in silicon, germanium or metallic materials, in an embodiment. Additionally, in an embodiment, absorption depths may be controlled in structures containing multiple conductor layers, or conductor layer containing multiple materials, or any other layer or combination of layers placed on a gate, substrate or other structure that is part of a semiconductor device.

As described above, a fourth topology may exist in respect of surface point 132, which lies over oxide isolation area 130. In an embodiment, prior to irradiation of surface point 148, a desired irradiation wavelength may be determined to control both absorption depth 149 below surface point 148 and absorption depth 139 below surface point 132, even though oxide isolation area 130 in substrate 110 lies below surface point 132, and may have heat conduction characteristics different from polysilicon layer 146 which is below surface point 148. In an embodiment, when surface point 148 and surface point 132 are irradiated, heat will not be absorbed in polysilicon layer 146 below absorption depth 149, and heat will not be absorbed in oxide isolation area 130 below absorption depth 139. In an embodiment, absorption depth 139 is substantially equivalent to absorption depth 149. In an embodiment, absorption depth 139 may extend through oxide isolation area 130 and into a section of silicon section 116 lying below oxide isolation area 130, or into another material that lies beneath oxide isolation area 130. Those skilled in the art will recognize that oxide isolation area 130 is representative of a type of isolation area, and should not be considered as limiting the scope of the subject matter. Absorption depth may be controlled in other types of isolations.

Those skilled in the art will recognize that the embodiments described above are not to be considered to be discrete embodiments. Various combinations of the embodiments are possible. For example, in an embodiment, when irradiating the entire surface of semiconductor structure 100, a desired absorption depth 149 at surface point 148 on polysilicon layer 146 may be determined, and a desired wavelength may be determined such that, in addition to controlling absorption depth 149 below surface point 148, absorption depth can also be controlled at a number of other surface points, such as surface point 122 and surface point 168.

Figure 2:
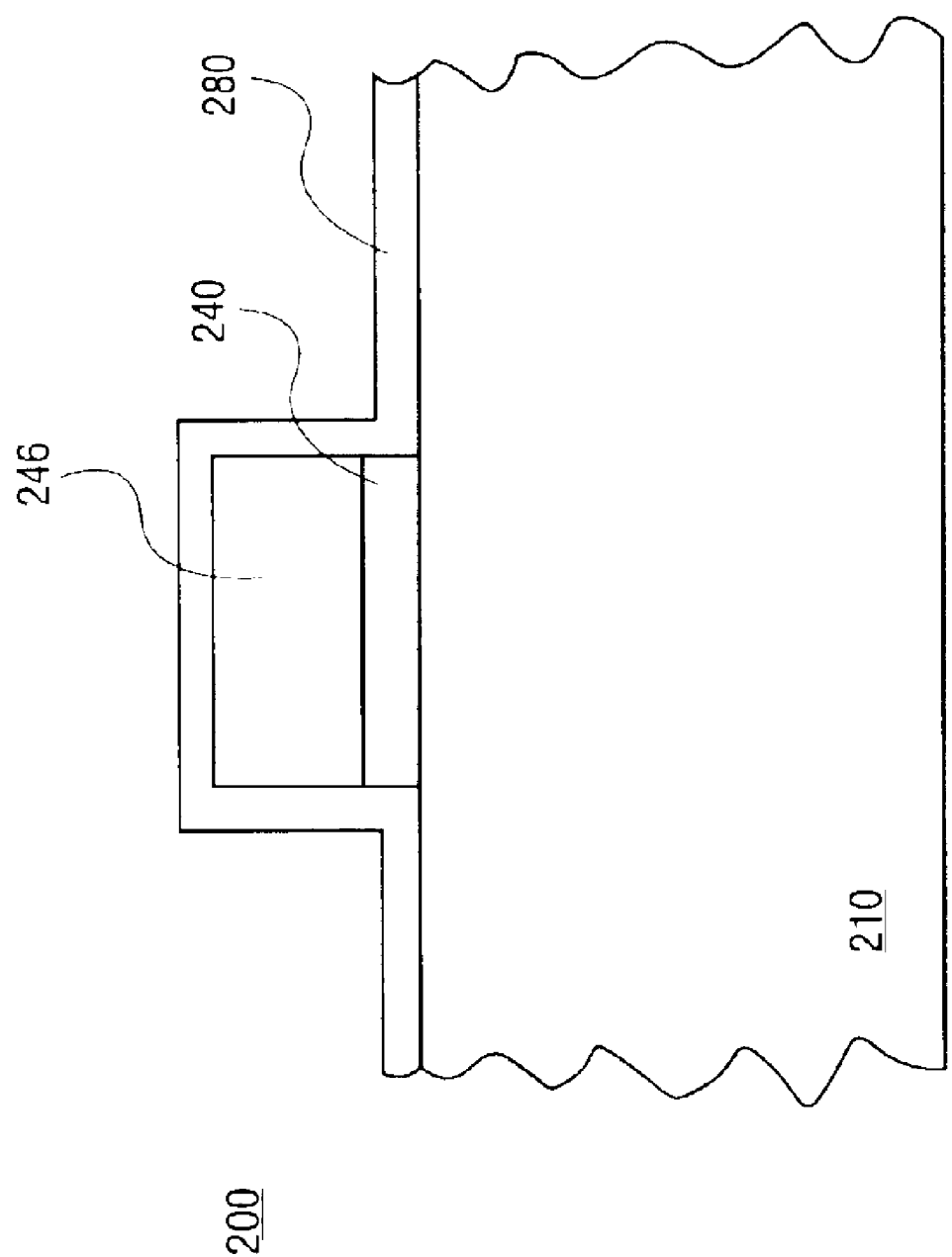
FIG. 2 is an illustration of a cross-sectional view of an embodiment of a semiconductor substrate with a device formed thereon, and a first capping layer formed over the device and the exposed portions of the top of the semiconductor substrate.

FIG. 2 illustrates an embodiment of semiconductor structure 200, which includes substrate 210. Gate dielectric 240 is formed on top of substrate 210. Conductor layer 246 is formed or deposited on top of gate dielectric 240. In an embodiment, conductor layer 246 may include polysilicon. However, it is recognized that other materials may also be used. In an embodiment, capping layer 280 is formed on top of conductor layer 246, on top of a portion the top surface of substrate 210 that is exposed (e.g., not covered by a gate or other structure), and on any exposed portion of gate dielectric 240. Capping layer 280 includes a material or materials that may be characterized, in general, as being less susceptible than conductor layer 246 to softening, surface tension effects and/or other causes of deformation. Therefore, representatively, in an embodiment, capping layer 280 may include one or more materials that have a higher melting point than the melting point of a material found in conductor layer 246.

For example, in an embodiment, capping layer 280 may include silicon dioxide ($SiO_2$), and conductor layer 246 includes a material having a melting point lower than the melting point of silicon dioxide ($SiO_2$). Under certain conditions, in such an embodiment, conductor layer 246 may begin to soften during irradiation, while capping layer 280 may not soften and retains its shape and stiffness, and, therefore, helps conductor layer 246 to maintain its mechanical and structural integrity and shape during irradiation.

In an embodiment, capping layer 280 may include one or more materials that are not heated when irradiated at a particular wavelength for which a material found in conductor layer 246 will be heated during irradiation. As such, when conductor layer 246 is irradiated at such a wavelength, capping layer 280 may not soften and retains its shape and stiffness, and, therefore, helps conductor layer 246 to maintain its mechanical and structural integrity and shape during irradiation. Similarly, in an embodiment, a material found in capping layer 280 might be heated at the particular wavelength, but to a lesser degree than a material found in the conductor layer. This embodiment also may be utilized to maintain the mechanical and structural integrity, and shape, of conductor layer 246 during irradiation. Additionally, capping layer 280 prevents or reduces contamination of conductor layer 246.

Additionally, in an embodiment, capping layer 280 includes a material that is non-reactive with a material in the conductor layer. In an embodiment, capping layer 280 may include a transparent material, to allow light to pass through to conductor layer 246.

It is recognized that capping layer 280 may include various materials. In an embodiment, capping layer 280 may include silicon dioxide ($SiO_2$). In another embodiment, capping layer 280 may include silicon nitride ($Si_3N_4$). In another embodiment, capping layer 280 may include a combination of silicon dioxide ($SiO_2$) and silicon nitride ($Si_3N_4$). These materials are only representative of materials that may be used in capping layer 280, and are not to be considered as limiting the scope of the subject matter. Additionally, in an embodiment, following heat treatment, capping layer 280 may be removed. Capping layer 280 may also help to prevent conductor layer 246 and surfaces of semiconductor structure 200 from becoming contaminated. The embodiments described are not to be considered as discrete embodiments in all cases. Various combinations of the embodiments are possible. For example, in an embodiment, capping layer 280 may include a material having a higher melting point than a material found in conductor layer 246, and, furthermore, capping layer 280 may be transparent and non-reactive with a material found in conductor layer 246.

Figure 3:
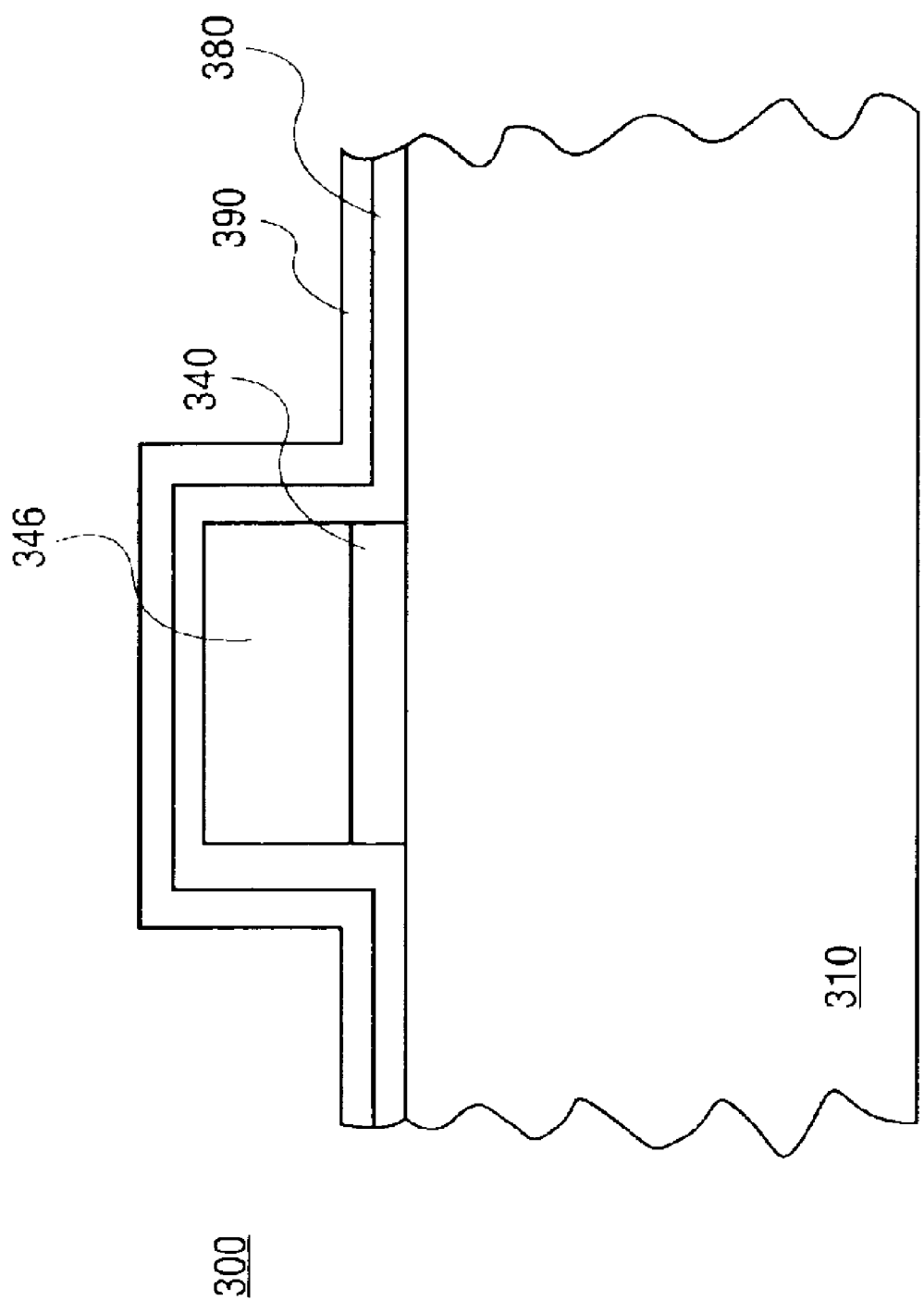
FIG. 3 is an illustration of a cross-section view of an embodiment of the structure of FIG. 2 with a second capping layer formed on the first capping layer.

FIG. 3 is an illustration of an embodiment of the structure shown in FIG. 2 with capping layer 380 and capping layer 390. In an embodiment, semiconductor structure 300 includes gate dielectric 340, which is formed or deposited on substrate 310. Conductor layer 346 is formed or deposited on gate dielectric 340. In an embodiment, conductor layer 346 may include polysilicon. However, it is recognized that other materials are also suitable. In an embodiment, first capping layer 380 may be formed or deposited on conductor layer 346, over a portion of the top of substrate 310 that is exposed (e.g., not covered by a gate or other structure), and over any exposed portions of gate dielectric 340. Second capping layer 390 may be formed or deposited on top of first capping layer 380.

In an embodiment, first capping layer 380 includes a material that is less susceptible to softening, surface tension effects, and/or other causes of deformation than a material found in conductor layer 346. For example, first capping layer 380 may include a material that has a higher melting temperature than a material found in conductor layer 346. Accordingly, under certain conditions, in an embodiment, if conductor layer 346 begins to soften, first capping layer 380 may not yet soften, due to its higher melting point. In this embodiment, despite the fact that conductor layer 346 softens, first capping layer 380, which does not soften or does not substantially soften, may essentially retain its shape and degree of stiffness, therefore helping conductor layer 346 to maintain its mechanical and structural integrity and shape. Similarly, second capping layer 390 includes a material that is less susceptible to softening, surface tension effects, and/or other causes of deformation than a material found in conductor layer 346. For example, under certain conditions, in an embodiment, if conductor layer 346 begins to soften, second capping layer 390 may not yet soften, due to its higher melting point. In this embodiment, despite the fact that conductor layer 346 softens, second capping layer 390, which does not soften or does not substantially soften, may essentially retain its shape and degree of stiffness, therefore helping conductor layer 346 to maintain its mechanical and structural integrity and shape. First capping layer 380 and second capping layer 390 also prevent or reduce contamination of conductor layer 346. Additionally, the use of an intermediary capping layer, such as first capping layer 380, eliminates any need to use material(s) in second capping layer 390 that do not react with a material in conductor layer 346.

In an embodiment, second capping layer 390 may include a material that is less susceptible to softening, surface tension effects and/or other causes of deformation than a material found in first capping layer 380. For example, second capping layer 390 may include a material that has a high melting temperature than a material found in first capping layer 380. Accordingly, under certain conditions, in an embodiment, if first capping layer 380 begins to soften, second capping layer 390 may not yet soften, due to its higher melting point. In this way, despite the fact that capping layer 380 softens, second capping layer 390, which does not soften or does not substantially soften, may essentially retain its shape and degree of stiffness, therefore helping first capping layer 380 and/or conductor layer 346 to maintain mechanical and structural integrity and shape.

For example, in an embodiment, first capping layer 380 includes silicon dioxide ($SiO_2$) and second capping layer 390 includes silicon nitride ($Si_3N_4$). The melting point of silicon dioxide ($SiO_2$) is lower than the melting point of silicon nitride ($Si_3N_4$). Therefore, under certain conditions, in an embodiment, first capping layer 380 may begin to soften, but second capping layer 390 will not soften, or will not substantially soften, and may help to maintain the mechanical and structural integrity and shape of first capping layer 380 and/or conductor layer 346.

In an embodiment, first capping layer 380 and second capping layer 390 is transparent, so as to allow light to pass through. In an embodiment, second capping layer 390 may be removed after heat treatment. Additionally, in an embodiment, both second capping layer 390 and first capping layer 380 may be removed after heat treatment. Capping layers 380 and/or 390 may also help to prevent conductor layer 346 and surfaces of semiconductor structure 300 from becoming contaminated.

The use of a single capping layer or two capping layers, as described above, may also be employed to maintain the mechanical and structural integrity and shape of structures other than conductor layers which may be used in semiconductor devices, as well as structures and surfaces found in other chemical, electrical or biological devices. Likewise, such capping layer(s) may also be used to maintain the mechanical and structural integrity and shape of substrate surfaces and other types of surfaces found in semiconductor devices. Additionally, it is recognized that more than two capping layers may be used and engineered so as to maintain the mechanical and structural integrity and shape of underlying structures or surfaces. The embodiments described above are not to be considered exclusive. Many combinations of the embodiments are possible. For example, in an embodiment, capping layer 380 may be non-reactive with a material in conductor layer 346, may be transparent, and also may have a higher melting temperature than a material in conductor layer 346.

Figure 4:
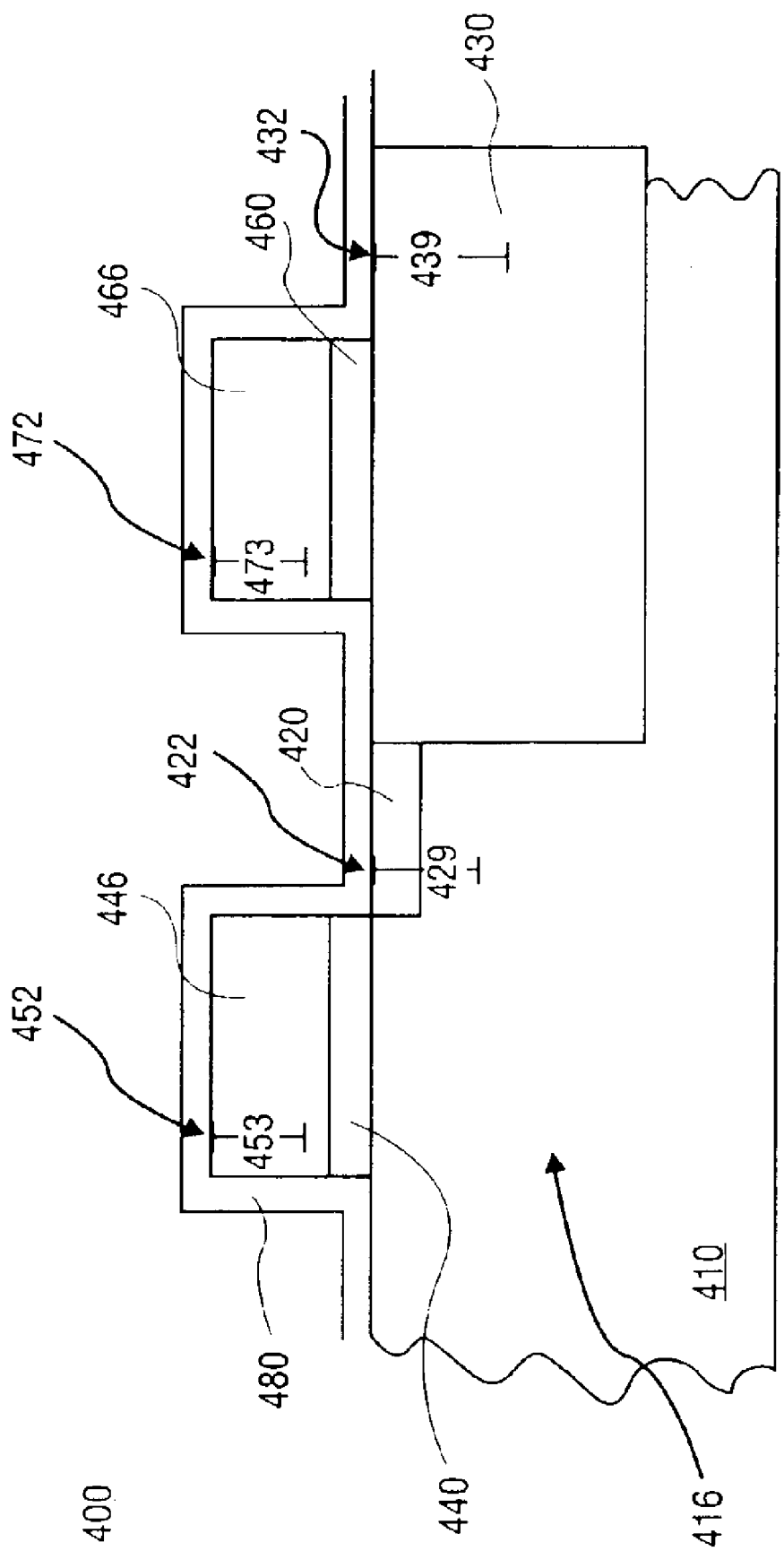
FIG. 4 is an illustration of a cross-sectional view of an embodiment of the structure of FIG. 1 with a first capping layer covering the devices and the exposed portions of the top of the semiconductor substrate.

FIG. 4 is an illustration of an embodiment of the structure shown in FIG. 1, with a capping layer formed or deposited thereon. Accordingly, FIG. 4 illustrates an embodiment that, in general, combines embodiments of the structures illustrated in FIG. 1 and FIG. 2. FIG. 4 shows semiconductor structure 400, which includes substrate 410. Substrate 410 may include various sections having different optical, chemical and/or electrical properties. In one embodiment, substrate 410 includes silicon section 416, P-N junction 420 and oxide isolation area 430. Devices may be formed on top of substrate 410. In an embodiment, gate dielectric 440 is formed on silicon section 416. In an embodiment, polysilicon layer 446 is formed or deposited as a conducting layer on gate dielectric 440. Similarly, in an embodiment, polysilicon layer 466 is formed or deposited on top of gate dielectric 460 as a conducting layer over oxide isolation area 430. Although polysilicon layers are used in this embodiment, it is recognized that other materials may also be used to form a conductor layer. In an embodiment, capping layer 480 may be formed or deposited on top of polysilicon layer 446, polysilicon layer 466, exposed areas on top of substrate 410, and over any exposed areas of gate dielectric 440.

In an embodiment, prior to irradiating semiconductor structure 400, a desired heat absorption depth 453 is determined in respect of polysilicon layer 446. In an embodiment, heat absorption depth 453 is measured from a point on the surface of polysilicon layer 446. Heat absorption depth 453 extends into polysilicon layer 446. In one embodiment, heat absorption depth 453 may range from 30–100 nm. In an embodiment, heat absorption depth 453 may also be less than 30 nm.

As described above in regard to FIG. 1, prior to irradiating surface point 452, a desired wavelength may be determined so as to control absorption depth at multiple surface points on semiconductor structure 400, even though the surface points and/or the materials below the surface points may have varying topographies and/or topologies. As stated above, irradiation at such a wavelength is an effective method of controlling absorption depth, which contributes toward preventing or reducing over-heating and the formation of defects. Additionally, the use of capping layer 480 also further helps in such efforts. Specifically, as described in regard to FIG. 2, capping layer 480 includes a material or materials that may be characterized, in general, as being less susceptible than polysilicon layer 446 (or a conductor layer made out of a different material) to softening, surface tension effects and/or other causes of deformation. Under certain conditions, in such an embodiment, in the event that conductor layer 446 may begin to soften during irradiation, capping layer 480 may not soften and retains its shape and stiffness, and, therefore, helps polysilicon layer 446 to maintain its mechanical and structural integrity and shape during irradiation. Capping layer 480 also prevents or reduces contamination of conductor layer 446

Representatively, in an embodiment, capping layer 480 may include one or more materials that have a higher melting point than the melting point of a material found in polysilicon layer 446. For example, in an embodiment, capping layer 480 may include silicon dioxide ($SiO_2$), which has a melting point higher than the melting point of polysilicon. Under certain conditions, in such an embodiment, polysilicon layer 446 may begin to soften during irradiation, while capping layer 480 may not soften and retains its shape and stiffness, and, therefore, helps polysilicon layer 446 to maintain its mechanical and structural integrity and shape during irradiation.

In an embodiment, capping layer 480 may include one or more materials that are not heated when irradiated at a particular wavelength in respect of which a material found in polysilicon layer 446 will be heated during irradiation. As such, when polysilicon layer 446 is irradiated at such a wavelength, capping layer 480 may not soften and retains its shape and stiffness, and, therefore, helps polysilicon layer 446 to maintain its mechanical and structural integrity and shape during irradiation. Similarly, in an embodiment, a material found in capping layer 480 might be heated at the particular wavelength, but to a lesser degree than a material found in the conductor layer. This embodiment also may be utilized to maintain the mechanical and structural integrity, and shape, of polysilicon layer 446 during irradiation. Additionally, in an embodiment, capping layer 480 includes a material that is non-reactive with a material in polysilicon layer 446. In an embodiment, capping layer 480 may include a transparent material, to allow light to pass through.

It is recognized that capping layer 480 may include various materials. In an embodiment, capping layer 480 may include silicon dioxide ($SiO_2$). In another embodiment, capping layer 480 may include silicon nitride ($Si_3N_4$). In another embodiment, capping layer 480 may include a combination of silicon dioxide ($SiO_2$) and silicon nitride ($Si_3N_4$). These materials are only representative of materials that may be used in capping layer 480, and are not to be considered as limiting the scope of the subject matter. Additionally, in an embodiment, following heat treatment, capping layer 480 may be removed. The embodiments described are not to be considered as discrete embodiments in all cases. Various combinations of the embodiments are possible. For example, in an embodiment, capping layer 480 may include a material having a higher melting point than a material found in polysilicon layer 446, and, furthermore, capping layer 480 may be transparent and non-reactive with a material found in polysilicon layer 446.

As described above, similar to the embodiment of the structure illustrated in FIG. 1, a desired wavelength may be determined in respect of the embodiment illustrated in FIG. 4, such that irradiation absorption depth may be controlled at multiple surface points on semiconductor structure 400 having varying topologies and/or topographies. Specifically, a desired irradiation wavelength based at least on an optical absorption coefficient associated with polysilicon layer 446 and the desired heat absorption depth 453 may be determined in an embodiment. A wavelength may be determined, in one embodiment, such that polysilicon layer 446, when irradiated, is not heated below the desired heat absorption depth 453. In an embodiment, a wavelength in the range of 300–400 nm may he employed. Different wavelengths may be needed depending on the optical absorption coefficients of the particular materials that make up a conductor layer, such as polysilicon layer 446.

A desired irradiation pulse duration for adiabatically heating polysilicon layer 446 may also be determined in an embodiment. At least a portion of semiconductor structure 400 including at least a portion of polysilicon layer 446 is irradiated. Irradiation includes at least one pulse of energy directed at the irradiated portion of semiconductor structure 400 for a duration substantially equivalent to the desired irradiation pulse duration at a wavelength that is substantially equivalent to the desired irradiation wavelength. In an embodiment, the duration of the irradiation pulse is less than a thermal time constant associated with a material in the portion of semiconductor structure 100 that is irradiated. Accordingly, the surface of the portion is adiabatically heated, because heating of the desired surfaces will take place before the heat has time to conduct down below a desired absorption depth. In one embodiment, the desired irradiation pulse duration is less than a 30 ps pulse. In a second embodiment, the desired irradiation pulse duration is an approximately 8 ps pulse. In another embodiment, the desired irradiation pulse is less than a 50 ps pulse. In one embodiment, in general, the irradiation pulse(s) are carried out with a power level of 18 $MW/cm^2$ and a pulse energy of 5.4E-4 $J/cm^2$. The figures described for the desired radiation pulse duration, power level and energy are representative of an embodiment, and should not be considered as limiting the scope of the subject matter described in this specification.

As described above, in general, absorption depth 453 in polysilicon layer 446 may be controlled by determining a desired wavelength for irradiation to be applied at surface point 452. Furthermore, a desired irradiation wavelength may be determined so that the heat absorption depth below multiple surface points may, in general, be controlled, even though the surface points have varying topographies. The points may be irradiated concurrently. Representatively, a desired wavelength may be determined such that when surface point 452 is irradiated at the desired wavelength, both absorption depth 453 below surface point 452 and absorption depth 429 below surface point 422 may be controlled, even though surface point 422 is on a lower vertical plane than surface point 452. Absorption depth 429 is measured downward from surface point 422 on P-N junction 420. In one embodiment, when surface point 452 and surface point 422 are irradiated, heat will not be absorbed in polysilicon layer 446 below absorption depth 453, and heat will not be absorbed in P-N junction 420 of substrate 410 below absorption depth 429. In an embodiment, absorption depth 429 is substantially equivalent to absorption depth 453.

Similar to the embodiment illustrated in FIG. 1, in an embodiment of semiconductor structure 400, a desired irradiation wavelength may be determined to control the absorption depth below various surface points during irradiation, even though those surface points, and/or the materials under the surface point, have varying topologies. For example, an irradiation wavelength may be determined such that when surface point 452 above polysilicon layer 446 is irradiated, in addition to controlling absorption depth 453, absorption depths with respect to other surface points on semiconductor structure 400 may also be controlled, even though materials different from polysilicon lie at the surface points and/or below the surface points. Representatively, prior to irradiation of surface point 452, a desired wavelength may be determined to control both absorption depth 453 below surface point 452 and absorption depth 429 below surface point 422, even though P-N junction 420 in substrate 410 lies below surface point 422, and may have heat conduction characteristics different from polysilicon layer 446 which is below surface point 452. In an embodiment, when surface point 452 and surface point 422 are irradiated, heat will not be absorbed in polysilicon layer 446 below absorption depth 453, and heat will not be absorbed in below absorption depth 429 in a section of silicon substrate 416 that lies beneath P-N junction 420, in an embodiment. In another embodiment, absorption depth 429 only extends into P-N junction 420, and does not extend beyond P-N junction 420 into silicon section 416. In an embodiment, absorption depth 429 is substantially equivalent to absorption depth 453. Additionally, it is recognized that absorption depth may be controlled in respect of other types of junctions, not merely P-N junctions as described above.

In an embodiment, capping layer 480 may include a material or materials that may be characterized, in general, as being less susceptible than a material found in silicon section 416, P-N junction 420, oxide isolation area 430, polysilicon layer 446 and/or other materials, surfaces or structures on a semiconductor device in regard to softening, surface tension effects and/or other causes of deformation. Under certain conditions, in such an embodiment, in the event that silicon section 416, P-N junction 420, oxide isolation area 430 and/or other materials, surfaces or structures on a semiconductor device may begin to soften during irradiation, capping layer 480 may not soften and retains its shape and stiffness, and, therefore, helps to maintain the mechanical and structural integrity and shape of silicon section 416, P-N junction 420, oxide isolation area 430, polysilicon layer 446 and/or other materials, surfaces or structures on a semiconductor device during irradiation. Capping layer 480 may also help to maintain the mechanical and structural integrity and shape of any exposed portions of gate dielectric 440, gate dielectric 460 and/or polysilicon layer 466.

As described above, a topology may exist in respect of surface point 472 that is different from the topology of surface point 452, even though both of these surface points lie above polysilicon layers (e.g., polysilicon layers 466 and 446, respectively). Specifically, silicon section 416 lies below surface point 452, and oxide isolation area 430 lies below surface point 472. Because the topology, including heat conduction characteristics of the underlying layers, may differ among these surface points, prior art methods of heating semiconductor structure 400 may result in uneven heating among these surface points. However, in an embodiment, during irradiation of surface point 452, a desired irradiation wavelength may be determined to control both absorption depth 453 below surface point 452, and absorption depth 473 below surface point 472. In one embodiment, when surface point 452 and surface point 472 are irradiated, heat will not be absorbed in polysilicon layer 446 below absorption depth 453, and heat will not be absorbed in polysilicon layer 466 below absorption depth 473. In an embodiment, absorption depth 473 is substantially equivalent to absorption depth 453. Absorption depth 473 only extends into polysilicon layer 466, in an embodiment. However, it is recognized that absorption depths may be controlled in other types of conducting layers or other types of materials, not merely in polysilicon. For example, representatively, absorption depth may be controlled in silicon, germanium or metallic materials, in an embodiment. Additionally, in embodiments, absorption depths may be controlled in structures containing multiple conductor layers, or conductor layers containing multiple materials, or any other layer or combination of layers placed on a gate, substrate or other structure that is part of a semiconductor device. Capping layer 480 also helps to maintain the mechanical integrity and structure and shape of polysilicon layer 446 and 466, in the event that they begin to soften, or experience surface tension effects and/or other causes of deformation. Accordingly, because the mechanical integrity and shape of these structures is maintained, P-N junction 420 can be characterized as abrupt.

As described above, a fourth topology may exist in respect of surface point 432, which lies over oxide isolation area 430. In an embodiment, prior to irradiation of surface point 452, a desired irradiation wavelength may be determined to control both absorption depth 453 below surface point 452 and absorption depth 439 below surface point 432, even though oxide isolation area 430 in substrate 410 lies below surface point 432, and may have heat conduction characteristics different from polysilicon layer 446 which lies below surface point 452. In an embodiment, when surface point 452 and surface point 432 are irradiated, the heat will not be absorbed in polysilicon layer 446 below absorption depth 453, and heat will not be absorbed in oxide isolation 430 below absorption depth 439. In an embodiment, absorption depth 439 is substantially equivalent to absorption depth 453. In an embodiment, absorption depth 439 may extend through oxide isolation area 430 and into a section of silicon section 416 lying beneath oxide isolation area 430, or into another material that lies beneath oxide isolation area 430. Those skilled in the art will recognize that oxide isolation area 430 is representative of a type of isolation area, and should not be considered as limiting the scope of the subject matter. Absorption depth may be controlled in other types of isolations.

Those skilled in the art will recognize that the embodiments described above are not to be considered to be discrete embodiments. Various combinations of the embodiments are possible. For example, in an embodiment, when irradiating the entire surface of semiconductor structure 400, a desired absorption depth 453 at surface point 452 on polysilicon layer 446 may be determined, and a desired wavelength may be determined such that, in addition to controlling absorption depth 453, absorption depth may also be controlled at a number of other surface points, such as surface point 422 and/or surface point 472.

Figure 5:
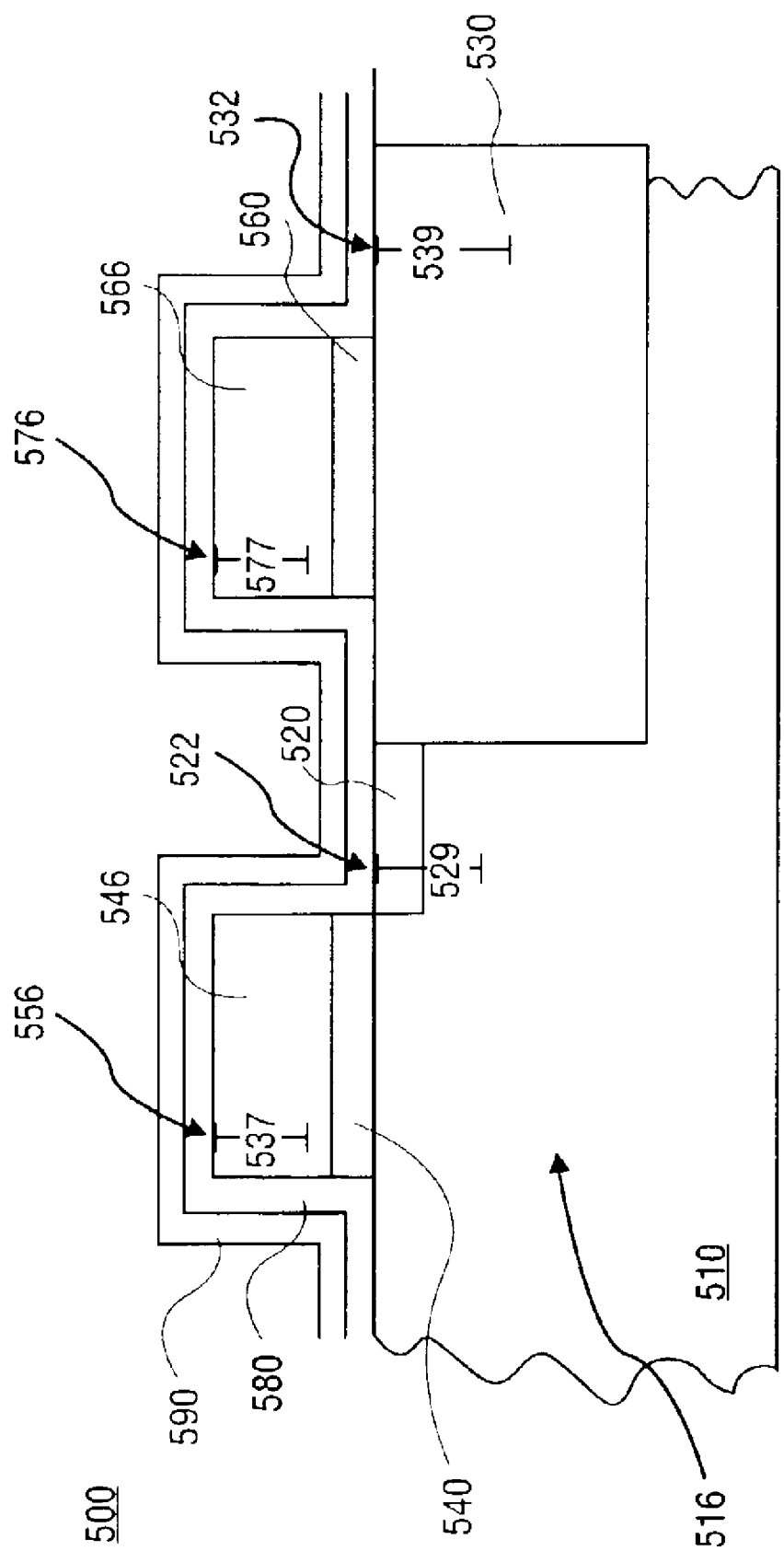
FIG. 5 is an illustration of a cross-sectional view of an embodiment of the structure of FIG. 4 with a second capping layer formed on the first capping layer.

FIG. 5 is an illustration of an embodiment of the structure shown in FIG. 1, with first capping layer 580 and second capping layer 590 formed or deposited thereon. Accordingly, FIG. 5 illustrates an embodiment that, in general, combines embodiments of the structures illustrated in FIG. 1 and FIG. 3. FIG. 5 illustrates an embodiment of semiconductor structure 500, which includes substrate 510. Substrate 510 may include various sections having different optical, chemical and/or electrical properties. In one embodiment, substrate 510 includes silicon section 516, P-N junction 520 and oxide isolation area 530. Devices may be formed on top of substrate 510.

In an embodiment, gate dielectric 540 is formed on silicon section 516. In an embodiment, polysilicon layer 546 is formed or deposited as a conductor layer on gate dielectric 540. Similarly, in an embodiment, polysilicon layer 566 is formed or deposited on top of gate dielectric 560 over oxide isolation area 530. Although polysilicon layers are used in this embodiment, it is recognized that other materials may also be used to form a conductor layer. In an embodiment, first capping layer 580 may be formed or deposited on top of polysilicon layer 546, polysilicon layer 566, exposed areas on top of substrate 510, and any exposed areas of gate dielectric 540. Second capping layer 590 is formed or deposited on at least a portion of first capping layer 590.

In an embodiment, prior to irradiating semiconductor structure 500, a desired heat absorption depth 557 is determined in respect of polysilicon layer 546. In an embodiment, heat absorption depth 557 is measured from a point on the surface of polysilicon layer 546. In an embodiment, heat absorption depth 557 may extend into polysilicon layer 546. In one embodiment, heat absorption depth 557 may range from 30–100 nm. In an embodiment, heat absorption depth 557 may also be less than 30 nm.

As described above in regard to FIG. 1, prior to irradiating surface point 556, a desired wavelength may be determined so as to control absorption depth at multiple surface points on semiconductor structure 500, even though the surface points and/or the materials below the surface points may have varying topographies and/or topologies. As stated above, irradiation at such a wavelength is an effective method of controlling absorption depth, which contributes toward preventing or reducing over-heating and the formation of defects. Additionally, the use of capping layers 580 and 590 may also further help in such efforts. Specifically, as described in regard to FIG. 3, capping layer 590 and/or capping layer 580 includes a material or materials that may be characterized, in general, as being less susceptible than polysilicon layer 546 (or a conductor layer made out of a different material) to softening, surface tension effects and/or other causes of deformation. Under certain conditions, in such an embodiment, in the event that conductor layer 546 may begin to soften during irradiation, capping layer 590 and/or 580 may not soften and retain shape and stiffness, and, therefore, may help polysilicon layer 546 to maintain its mechanical and structural integrity and shape during irradiation.

In an embodiment, first capping layer 580 includes a material that is less susceptible to softening, surface tension effects, and/or other causes of deformation than a material found in polysilicon layer 546. For example, first capping layer 580 may include a material that has a higher melting temperature than a material found in polysilicon layer 546. Accordingly, under certain conditions, in an embodiment, if polysilicon layer 546 begins to soften, first capping layer 580 may not yet soften, due to its higher melting point. In this embodiment, despite the fact that polysilicon layer 546 softens, first capping layer 580, which does not soften or does not substantially soften, may essentially retain its shape and degree of stiffness, therefore helping polysilicon layer 546 to maintain its mechanical and structural integrity and shape. Similarly, second capping layer 590 includes a material that is less susceptible to softening, surface tension effects, and/or other causes of deformation than a material found in polysilicon layer 546. For example, under certain conditions, in an embodiment, if polysilicon layer 546 begins to soften, second capping layer 590 may not yet soften, due to its higher melting point. In this embodiment, despite the fact that polysilicon layer 546 softens, second capping layer 590, which does not soften or does not substantially soften, may essentially retain its shape and degree of stiffness, therefore helping polysilicon layer 546 to maintain its mechanical and structural integrity and shape.

In an embodiment, second capping layer 590 may include a material that is less susceptible to softening, surface tension effects and/or other causes of deformation than a material found in first capping layer 580. For example, second capping layer 590 may include a material that has a higher melting temperature than a material found in first capping layer 580. Accordingly, under certain conditions, in an embodiment, if first capping layer 580 begins to soften, second capping layer 590 may not yet soften, due to its higher melting point. In this way, despite the fact that capping layer 580 softens, second capping layer 590, which does not soften or does not substantially soften, may essentially retain its shape and degree of stiffness, therefore helping first capping layer 580 and/or polysilicon layer 546 to maintain mechanical and structural integrity and shape.

For example, in an embodiment, first capping layer 580 includes silicon dioxide ($SiO_2$) and second capping layer 590 includes silicon nitride ($Si_3N_4$). The melting point of silicon dioxide ($SiO_2$) is lower than the melting point of silicon nitride ($Si_3N_4$). Therefore, under certain conditions, in an embodiment, first capping layer 580 may begin to soften, but second capping layer 590 will not soften, or will not substantially soften, and may help to maintain the mechanical and structural integrity and shape of first capping layer 580 and/or polysilicon layer 546.

In an embodiment, first capping layer 580 and second capping layer 590 are transparent, so as to allow light to pass through. In an embodiment, second capping layer 590 may be removed after heal treatment. Additionally, in an embodiment, both second capping layer 590 and first capping layer 580 may be removed after heat treatment. The use of an intermediary capping layer, such as first capping layer 580, eliminates any need to use material(s) in second capping layer 590 that do not react with a material in conductor layer 546, in an embodiment. First capping layer 580, as well as second capping layer 590, also eliminate or reduce contamination of conductor layer 546.

The use of a single capping layer or two capping layers, as described above, may also be employed to maintain the mechanical and structural integrity and shape of structures other than conductor layers which may be used in semiconductor devices, as well as structures and surfaces found in other chemical, electrical or biological devices. Likewise, such capping layer(s) may also be used to maintain the mechanical and structural integrity and shape of substrate surfaces and other types of surfaces found in semiconductor devices. Additionally, it is recognized that more than two capping layers may be used and engineered so as to maintain the mechanical and structural integrity and shape of underlying structures or surfaces. The embodiments described above are not to be considered exclusive. Many combinations of the embodiments are possible. For example, in an embodiment, capping layer 580 may be non-reactive with a material in polysilicon layer 546, may be transparent, and also may have a higher melting temperature than a material in polysilicon layer 546.

As described above, similar to the embodiment of the structure illustrated in FIG. 1, a desired wavelength may be determined in respect of the embodiment of FIG. 5, such that irradiation absorption depth may be controlled at multiple surface points on semiconductor structure 500 having varying topologies and/or topographies. Specifically, a desired irradiation wavelength based at least on an optical absorption coefficient associated with polysilicon layer 546 and the desired heat absorption depth 557 may be determined in an embodiment. A wavelength is determined, in one embodiment, such that polysilicon layer 546, when irradiated, is not heated below the desired heat absorption depth 557. In an embodiment, a wavelength in the range of 300–400 nm is employed. Different wavelengths may be needed depending on the optical absorption coefficients of the particular materials that make up a conductor layer, such as polysilicon layer 546.

A desired irradiation pulse duration for adiabatically heating polysilicon layer 546 may also be determined in an embodiment. At least a portion of semiconductor structure 500, including polysilicon layer 546 is irradiated. Irradiation includes at least one pulse of energy directed at the irradiated portion of semiconductor structure 500 for a duration substantially equivalent to the desired irradiation pulse duration at a wavelength that is substantially equivalent to the desired irradiation wavelength. In an embodiment, the duration of the irradiation pulse is less than a thermal time constant associated with a material in the portion of semiconductor structure 100 that is irradiated. Accordingly, the surface of the portion is adiabatically heated, because heat may be substantially absorbed before it has time to conduct down below a desired absorption depth. In one embodiment, the desired irradiation pulse duration is less than a 30 ps pulse. In a second embodiment, the desired irradiation pulse duration is approximately 8 ps. In a third embodiment, the desired irradiation pulse is less than a 50 ps pulse. In one embodiment, in general, the irradiation pulse(s) are carried out with a power level of 18 MW/cm$^2$ and a pulse energy of 5.4E-4 J/cm$^2$. The figures described for the desired radiation pulse duration, power level and energy are representative of an embodiment, and should not be considered as limiting the scope of the subject matter described in this specification.

As described above, in general, absorption depth 557 in polysilicon layer 546 may be controlled by determining a desired wavelength for irradiation to be applied at surface point 556. Furthermore, a desired irradiation wavelength may be determined so that the heat absorption depth below multiple surface points may, in general, be controlled, even though the surface points have varying topographies. Representatively, a desired wavelength may be determined such that when surface point 556 is irradiated at the desired wavelength, both absorption depth 557 below surface point 556 and absorption depth 529 below surface point 522 may be controlled, even though surface point 522 is on a lower vertical plane than surface point 556. In an embodiment, the surface points are irradiated concurrently. Absorption depth 529 is measured downward from surface point 522. In one embodiment, when surface point 556 and surface point 522 are irradiated, heat will not be absorbed in polysilicon layer 546 below absorption depth 557, and heat will not be absorbed in P-N junction 520 of substrate 510 below absorption depth 529. In an embodiment, absorption depth 529 is substantially equivalent to absorption depth 557.

Similar to the embodiment illustrated in FIG. 1, in an embodiment of semiconductor structure 500, a desired irradiation wavelength may be determined to control the absorption depth below various surface points during irradiation, even though those surface points, and/or the materials under the surface point, have varying topologies. For example, an irradiation wavelength may be determined such that when surface point 556 above polysilicon layer 546 is irradiated, in addition to controlling absorption depth 557, absorption depths with respect to other surface points on semiconductor structure 500 may also be controlled, even though materials different from polysilicon lie at the surface points and/or below the surface points. Representatively, prior to irradiation of surface point 556, a desired irradiation wavelength may be determined to control both absorption depth 557 below surface point 556 and absorption depth 529 below surface point 522, even though silicon section P-N junction 520 in substrate 510 lies below surface point 522, and may have heat conduction characteristics different from polysilicon layer 546, which is below surface point 556. In an embodiment, when surface point 556 and surface point 522 are irradiated, heat will not be absorbed in polysilicon layer 546 below absorption depth 557, and heat will not be absorbed below absorption depth 529 in a section of silicon substrate 516 that lies beneath P-N junction 520, in an embodiment. In another embodiment, absorption depth 529 only extends into P-N junction 520, and does not extend beyond P-N junction 520 into silicon section 516. In an embodiment, absorption depth 529 is substantially equivalent to absorption depth 557. Additionally, it is recognized that absorption depth may be controlled in respect of other types of junctions, not merely P-N junctions as described above.

In embodiments, first capping layer 580 and/or second capping layer 590 may include a material or materials that may be characterized, in general, as being less susceptible than a material found in silicon section 516, P-N junction 520, oxide isolation area 530, polysilicon layer 546 and/or other materials, surfaces or structures on a semiconductor device in regard to softening, surface tension effects and/or other causes of deformation. Under certain conditions, in such an embodiment, in the event that silicon section 516, P-N junction 520, oxide isolation area 530, polysilicon layer 546 and/or other materials, surfaces or structures on a semiconductor device may begin to soften during irradiation, first capping layer 580 and/or second capping layer 590 may not soften, but retain shape and stiffness, and, therefore, help to maintain the mechanical and structural integrity and silicon section 516, shape of P-N junction 520, oxide isolation area 530, polysilicon layer 546 and/or other materials, surfaces or structures on semiconductor device 510 during irradiation. In an embodiment, capping layer 580 may also help to maintain the mechanical and structural integrity and shape of any exposed portions of gate dielectric 540 and gate dielectric 560, as well as polysilicon layer 566.

As described above, a topology may exist in respect of surface point 576 that is different from the topology of surface point 556, even though both of these surface points lie above polysilicon layers (e.g., polysilicon layers 566 and 546, respectively). Specifically, silicon section 516 lies below surface point 556, and oxide isolation area 530 lies below surface point 576. Because the topology, including heat conduction characteristics of the underlying layers, may differ among these surface points, prior art methods of heating semiconductor structure 500 may result in uneven heating among these surface points. However, in an embodiment, prior to irradiation of surface point 556, a desired irradiation wavelength may be determined to control both absorption depth 557 below surface point 556, and absorption depth 577 below surface point 576. In one embodiment, when surface point 556 and surface point 576 are irradiated, heat will not be absorbed in polysilicon layer 546 below absorption depth 557, and heat will not be absorbed in polysilicon layer 566 below absorption depth 577. In an embodiment, absorption depth 577 is substantially equivalent to absorption depth 557. Absorption depth 577 only extends into polysilicon layer 566, in an embodiment. As shown in the above embodiments, absorption depths 557 and 577 in polysilicon layers 546 and 566 may be controlled. However, it is recognized that absorption depths may be controlled in other types of conducting layers or other types of materials, not merely in polysilicon. For example, representatively, absorption depth may be controlled in silicon, germanium or metallic materials, in an embodiment. Additionally, in embodiments, absorption depths may be controlled in structures containing multiple conductor layers, or conductor layer containing multiple materials, or any other layer or combination of layers placed on a gate, substrate or other structure that is part of a semiconductor device. First capping layer 580 and second capping layer 590 also help to maintain the mechanical integrity and structure and shape of polysilicon layer 566, in the event that polysilicon layer 566 begins to soften, or experiences surface tension effects and/or other causes of deformation.

As described above, a fourth topology may exist in respect of surface point 532, which lies over oxide isolation area 530. In an embodiment, prior to irradiation of surface point 556, a desired irradiation wavelength may be determined to control both absorption depth 557 below surface point 556 and absorption depth 539 below surface point 532, even though oxide isolation area 530 in substrate 510 lies below surface point 532, and may have heat conduction characteristics different from polysilicon layer 546, which is below surface point 556. In an embodiment, when surface point 556 and surface point 532 are irradiated, heat will not be absorbed in polysilicon layer 546 below absorption depth 557, and heat will not be absorbed in oxide isolation area 530 below absorption depth 539. In an embodiment, absorption depth 539 is substantially equivalent to absorption depth 557. In an embodiment, absorption depth 539 may extend through oxide isolation area 530 and into a section of silicon section 516 lying beneath oxide isolation area 530, or into another material that lies beneath oxide isolation area 530. Those skilled in the art will recognize that oxide isolation area 530 is representative of a type of isolation, and should not be considered as limiting the scope of the subject matter. Absorption depth may be controlled in other types of isolations.

Those skilled in the art will recognize that the embodiments described above are not to be discrete embodiments. Various combinations of the embodiments are possible. For example, in an embodiment, when irradiating the entire surface of semiconductor structure 500, a desired absorption depth 557 at surface point 556 on polysilicon layer 546 may be determined, and a desired wavelength may be determined such that, in addition to controlling absorption depth 557, absorption depth may also be controlled at a number of other surface points, such as surface point 522 and/or surface point 576.

What is claimed is:

1. A method comprising:
   determining a desired heat absorption depth for a structure in a semiconductor device;
   determining a desired irradiation wavelength based at least on an optical absorption coefficient associated with the structure and the desired heat absorption depth for the structure;
   determining a desired irradiation pulse duration for heating the structure; and
   irradiating a portion of the surface of the semiconductor device, the portion comprising the structure, the irradiating comprising directing at least one pulse of energy toward the portion of the surface of the semiconductor device for a duration substantially equivalent to the desired irradiation pulse duration, the at least one pulse of energy comprising a wavelength substantially equivalent to the desired irradiation wavelength, wherein the desired irradiation pulse duration is less than 50 picoseconds.

2. The method of claim 1, wherein the determining a desired irradiation wavelength comprises determining a wavelength such that the irradiating a portion of the surface of the semiconductor device heats at least a section of the structure to approximately the desired absorption depth.

3. The method of claim 1, wherein the determining a desired irradiation wavelength comprises determining a wavelength such that the irradiating a portion of the surface of the semiconductor device does not substantially heat a section of the structure below the desired absorption depth.

4. The method of claim 1, wherein the irradiating a portion of the surface of the semiconductor device comprises irradiating at least a first surface point within the portion of the surface of the semiconductor device and a second surface point within the portion of the surface of the semiconductor device, the first surface point and the second surface point on different horizontal planes, and
   wherein the determining a desired irradiation pulse duration comprises determining an irradiation pulse duration such that when the portion of the surface of the semiconductor device is irradiated, a section of the structure beneath the first surface point is heated down to approximately the desired absorption depth and is not substantially heated below the desired absorption depth, and a section of the semiconductor device beneath the second surface point is heated down to the desired heat absorption depth and is not substantially heated below the desired absorption depth.

5. The method of claim 1, wherein the irradiating a portion of the surface of the semiconductor device comprises irradiating at least a first surface point within the portion of the surface of the semiconductor device and a second surface point within the portion of the surface of the semiconductor device, wherein a section of the semiconductor device below the first surface point comprises a first material and a section of the semiconductor device below the second surface point comprises a second material, the second material different from the first material, and
   wherein the determining the desired irradiation pulse duration comprises determining an irradiation pulse duration such that when the first surface point is irradiated, the section of the semiconductor device below the first surface point is heated down to approximately the desired absorption depth and is not substantially heated below the desired absorption depth, and the section of the semiconductor device below the second surface point is heated down to the desired heat absorption depth and is not substantially heated below the desired absorption depth.

6. The method of claim 4, wherein the first surface point is on a conductor layer, the conductor layer formed on a gate, the gate formed on a substrate.

7. The method of claim 4, wherein the first surface point is on a conductor layer, the conductor layer formed on an oxide isolation area.

8. The method of claim 4, wherein the first surface point is on a surface of a substrate.

9. The method of claim 5, wherein the section of the substrate below the first surface point comprises a junction.

10. The method of claim 5, wherein the section of the substrate below the first surface point comprises an oxide.

11. The method of claim 5, wherein the section of the substrate below the first surface point comprises a diffusion layer and the second material comprises an oxide.

12. The method of claim 6 wherein the conductor layer comprises polysilicon.

13. The method of claim 7, wherein the conductor layer comprises polysilicon.

14. A method comprising
forming a first material layer on at least a portion of a semiconductor structure;
forming a first capping layer on top of the first material layer, wherein the first capping layer serves to maintain shape of the first material layer during irradiation;
determining a desired heat absorption depth;
determining a desired irradiation wavelength based at least on the desired heat absorption depth; and
irradiating a portion of the surface of the first capping layer, the irradiating comprising directing at least one pulse of energy toward the portion of the surface of the semiconductor device, the at least one pulse of energy comprising a wavelength substantially equivalent to the desired irradiation wavelength, wherein each pulse of energy has a duration less than 50 picoseconds.

15. The method of claim 14, further comprising:
forming a second capping layer on top of at least a portion of the surface first capping layer.

16. The method of claim 14 wherein the first capping layer comprises silicon dioxide ($SiO_2$).

17. The method of claim 14 further comprising:
removing at least the first capping layer after the irradiating a portion of the surface of the first capping layer.

18. The method of claim 14, wherein the first capping layer has a melting point higher than a melting point of the first material layer.

19. The method of claim 14, wherein the structure comprises a first material and the first capping layer comprises a second material, the second material substantially nonreactive with the first material.

20. The method of claim 14, wherein the structure comprises a first material that is heated when irradiated at a wavelength and the first capping layer comprises a second material, the second material not substantially heated when irradiated at the wavelength.

21. The method of claim 15, wherein the second capping layer comprises $Si_3N_4$.

22. The method of claim 15, wherein the structure comprises a first material and the second capping layer comprises a second material, the second material having a melting point higher than a melting point of the first material.

23. The method of claim 15, wherein the second capping layer is substantially transparent.

24. The method of claim 16 wherein the first capping layer further comprises $Si_3N_4$.

25. A method comprising:
adiabatically heating a portion of a surface of a semiconductor device by directing at least one pulse of energy towards the portion of the surface of the semiconductor device, wherein each pulse of energy has a duration less than 50 picoseconds.

26. The method of claim 25 wherein adiabatically heating comprises:
adiabatically heating a first surface point and a second surface point, wherein the second surface point is on a lower vertical plane than the first surface point.

27. The method of claim 26, wherein the first surface point is on a conductor layer and
the second surface point lies on a substrate surface.

28. The method of claim 25 wherein adiabatically heating comprises:
adiabatically heating a first surface point and a second surface point, wherein the first surface point and the second surface point have varying topologies.

29. The method of claim 28, wherein the first surface point lies on a conductor layer and the second surface point lies on a junction.

30. The method of claim 29, wherein the first surface point lies on a first conductor layer and the second surface point lies on a second conductor layer.

31. The method of claim 14, wherein the first capping layer is less susceptible than the first material layer to soften during irradiation.

* * * * *

UNITED STATES PATENT AND TRADEMARK OFFICE
CERTIFICATE OF CORRECTION

PATENT NO. : 6,952,269 B2
DATED : October 4, 2005
INVENTOR(S) : Maiz et al.

It is certified that error appears in the above-identified patent and that said Letters Patent is hereby corrected as shown below:

Column 10,
Line 21, delete "he" and insert -- be --.

Column 14,
Line 43, delete "heal" and insert -- heat --.

Column 15,
Line 42, delete "arc" and insert -- are --.

Column 17,
Line 52, after "not", insert -- to be considered --.

Signed and Sealed this

Twenty-fourth Day of January, 2006

JON W. DUDAS
*Director of the United States Patent and Trademark Office*